(12) United States Patent
Rho et al.

(10) Patent No.: US 11,048,027 B2
(45) Date of Patent: Jun. 29, 2021

(54) DIELECTRIC BASED REFLECTIVE COLOR FILTER AND MANUFACTURING METHOD THEREOF AND DISPLAY DEVICE HAVING THE SAME

(71) Applicant: POSTECH Academy-Industry Foundation, Pohang-si (KR)

(72) Inventors: Jun Suk Rho, Pohang-si (KR); Jae Hyuck Jang, Goyang-si (KR); Heon Yeong Jeong, Yongin-si (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 427 days.

(21) Appl. No.: 16/221,342

(22) Filed: Dec. 14, 2018

(65) Prior Publication Data

US 2019/0187346 A1 Jun. 20, 2019

(30) Foreign Application Priority Data

Dec. 14, 2017 (KR) .................. 10-2017-0172345

(51) Int. Cl.
 *G02B 5/20* (2006.01)
 *G03F 7/00* (2006.01)
 *G02B 5/26* (2006.01)
 *G02B 1/00* (2006.01)

(52) U.S. Cl.
 CPC ............ *G02B 5/201* (2013.01); *G02B 1/002* (2013.01); *G02B 5/203* (2013.01); *G02B 5/204* (2013.01); *G02B 5/26* (2013.01); *G03F 7/0007* (2013.01)

(58) Field of Classification Search
 CPC ....... G03F 7/0007; G02B 5/201; G02B 5/203; G02B 5/204; G02B 5/26; B42D 5/201; B42D 5/203; B42D 5/204; B42D 5/26
 USPC .................................. 430/7, 292; 283/85, 91
 See application file for complete search history.

(56) References Cited

U.S. PATENT DOCUMENTS

| | | | |
|---|---|---|---|
| 2009/0284696 A1* | 11/2009 | Cheong .................. | B82Y 20/00 349/106 |
| 2015/0076808 A1* | 3/2015 | Kim ........................ | B32B 27/20 283/85 |
| 2016/0131808 A1* | 5/2016 | Kristensen ............. | G02B 5/207 359/884 |
| 2016/0274282 A1* | 9/2016 | Shen ....................... | G02B 5/207 |
| 2018/0150849 A1* | 5/2018 | James ................ | G06Q 30/0185 |

FOREIGN PATENT DOCUMENTS

| | | |
|---|---|---|
| JP | 2012-220832 | 11/2012 |
| KR | 10-1557800 | 10/2015 |
| KR | 10-2016-0125694 | 11/2016 |

* cited by examiner

*Primary Examiner* — John A McPherson
(74) *Attorney, Agent, or Firm* — Lew IP Meister, PLLC

(57) ABSTRACT

A dielectric-based reflective color filter includes a substrate layer capable of light reflection; and a dielectric layer formed on the substrate layer. The dielectric layer includes a plurality of dielectric units configured by a first structure extending in a first direction and a second structure intersecting the first structure and extending in a second direction. The plurality of the dielectric units is arranged on the substrate layer so as to be spaced apart from each other.

20 Claims, 7 Drawing Sheets
(3 of 7 Drawing Sheet(s) Filed in Color)

DIELECTRIC BASED REFLECTIVE COLOR FILTER AND MANUFACTURING METHOD THEREOF AND DISPLAY DEVICE HAVING THE SAME

TECHNICAL FIELD

The disclosure relates to a dielectric-based reflective color filter, a manufacturing method thereof, and a display device including the same.

BACKGROUND

Generally, a reflective color filter means that colors may be implemented by reflecting external light such as white light by reflection means instead of using artificial internal light consuming power. That is, the reflective color filter may display colors by selectively reflecting only a particular wavelength when reflecting incident white light. Such reflective color filters may have high energy efficiency, low power consumption and excellent readability. Accordingly, various attempts have been made to apply them to display devices This reflective color filter is dominated by color filters using metal-based (Plasmonics) meta-materials. However, due to inherent losses in the metal, it is difficult to achieve high efficiency. Recently, there has been an attempt to replace a metal-based structure with a dielectric-based structure.

These attempts are largely divided into studying the material and shape of the dielectric nano-structure constituting the color filter. For example, the research results have been presented that form a nano-structure in the form of a square, a cylinder, a hemisphere, and the like.

However, such conventional research results are limited in the kinds of colors that may be expressed, so that they are difficult to be commercialized, and there is a limitation that they may not be practically applied to the display device.

Further, the simple rectangular, cylindrical, and hemispherical shapes have limitations in that they do not represent dynamic changes due to the polarization of light due to their structural properties such as symmetry.

SUMMARY

Embodiments of the disclosure provide a dielectric-based reflective color filter capable of implementing more colors, a method of manufacturing the same, and a display device including the same.

Further, the embodiments of the disclosure provide a dielectric-based reflective color filter capable of changing a color according to a change in a polarization angle of an incident light, a method for manufacturing the same, and a display device including the same.

In accordance with an aspect of the present invention, there is provided a dielectric-based reflective color filter, comprising: a substrate layer capable of light reflection; and a dielectric layer formed on the substrate layer, wherein the dielectric layer includes a plurality of dielectric units configured by a first structure extending in a first direction and a second structure intersecting the first structure and extending in a second direction: and the plurality of the dielectric units is arranged on the substrate layer so as to be spaced apart from each other.

The aspect is directed to the dielectric-based reflective color filter, wherein the first structure is symmetrical about an intersection where the first structure and the second structure intersect with each other.

The aspect is directed to the dielectric-based reflective color filter, wherein the second structure is symmetrical about the intersection.

The aspect is directed to the dielectric-based reflective color filter, wherein the first structure has a rectangular plane.

The aspect is directed to the dielectric-based reflective color filter, wherein the second structure has a rectangular plane.

The aspect is directed to the dielectric-based reflective color filter, wherein the first structure and the second structure are formed in a rectangular parallelepiped shape and have the same height.

The aspect is directed to the dielectric-based reflective color filter, wherein the first structure and the second structure has a height of 200 nm.

The aspect is directed to the dielectric-based reflective color filter, wherein the dielectric unit has a '+' shaped plane.

The aspect is directed to the dielectric-based reflective color filter, wherein the first direction and the second direction are perpendicular to each other.

The aspect is directed to the dielectric-based reflective color filter, wherein the first structure and the second structure have a length of 60 nm to 220 nm, and the first structure and the second structure have a width of 40 nm to 120 nm, and the center on the plane of the first structure and the second structure coincide with each other.

The aspect is directed to the dielectric-based reflective color filter, wherein at least portion of the plurality of dielectric units is formed such that the first direction is different from other portions of the plurality of dielectric units.

The aspect is directed to the dielectric-based reflective color filter, wherein at least portion of the plurality of dielectric units is formed such that the first direction is equal to other portions of the plurality of dielectric units.

The aspect is directed to the dielectric-based reflective color filter, wherein the first direction forms a predetermined angle with a polarized direction of incident light, and the second direction is perpendicular to the first direction.

The aspect is directed to the dielectric-based reflective color filter, wherein the substrate layer is made of silicon dioxide and the dielectric layer is made of amorphous silicon.

In accordance with an aspect of the present invention, there is provided a method of manufacturing a dielectric-based reflective color filter, comprising: preparing a substrate layer;

laminating a dielectric layer to the substrate layer; laminating a photoresist to the dielectric layer; forming, on the photoresist, a pattern including a plurality of dielectric units having a first structure extending in a first direction and a second structure intersecting the first structure and extending in a second direction; depositing a film layer on the pattern; removing a remaining film except the film corresponding to the pattern through a lift-off and the photoresist; and etching a portion except for the dielectric layer corresponding to the pattern.

The aspect is directed to the method, wherein the substrate layer is made of silicon dioxide and the dielectric layer is made of amorphous silicon.

The aspect is directed to the method, wherein the amorphous silicon is deposited on the substrate layer by a PE-CVD process.

The aspect is directed to the method, wherein the first direction and the second direction are perpendicular to each other, and the first structure and the second structure have a rectangular shape in a plane.

The aspect is directed to the method, wherein the pattern is formed by E-beam lithography and the film is made of chromium.

According to one aspect of the disclosure, the dielectric-based reflective color filter or the display device including the dielectric-based reflective color filter manufactured by the manufacturing method may be provided.

According to one embodiment of the disclosure, a dielectric-based reflective color filter capable of implementing more colors, a manufacturing method thereof, and a display device including a dielectric-based reflective color filter may be provided.

Further, according to the embodiments of the disclosure, a dielectric-based reflective color filter capable of changing a color according to a change in a polarization angle of an incident light, a method for manufacturing the same, and a display device including the same may be provided.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

The above and other objects, features and other advantages of the present disclosure will be more clearly understood from the following detailed description taken in conjunction with the accompanying drawings, in which.

DETAILED DESCRIPTION

Hereinafter, specific embodiments of the present disclosure will be described in detail with reference to the drawings.

Further, if the gist of the disclosure may be obscured in the description of the disclosure, the detailed descriptions of the related known constitution or function may be omitted.

Figure 1:
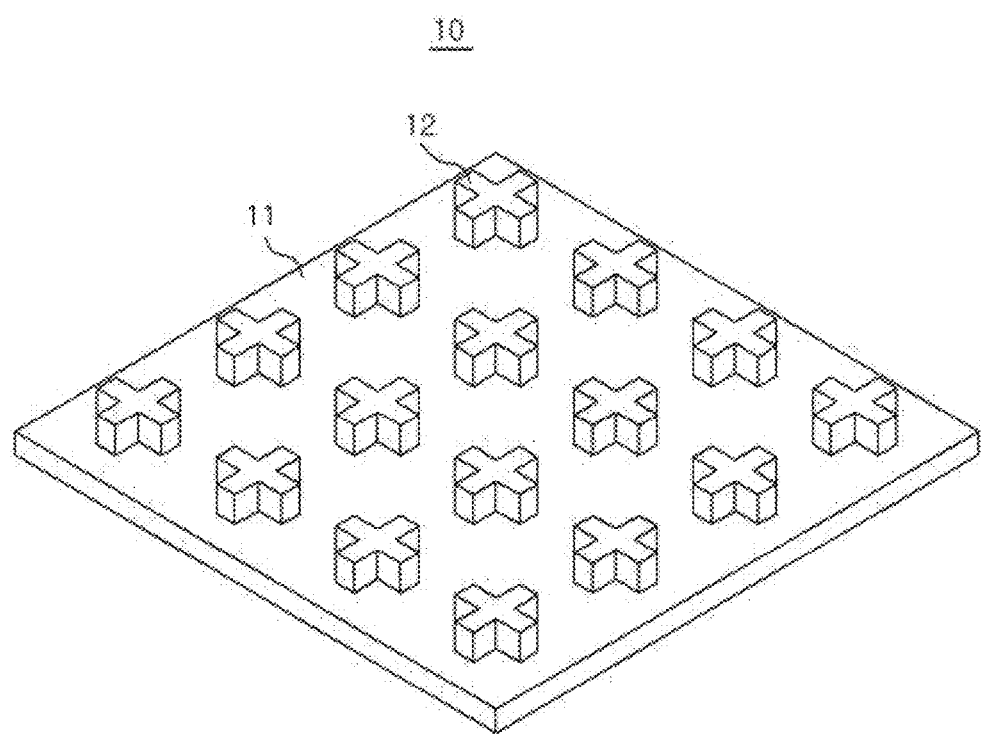
FIG. 1 is a perspective view showing a dielectric-based reflective color filter according to an embodiment of the disclosure.
Figure 2:
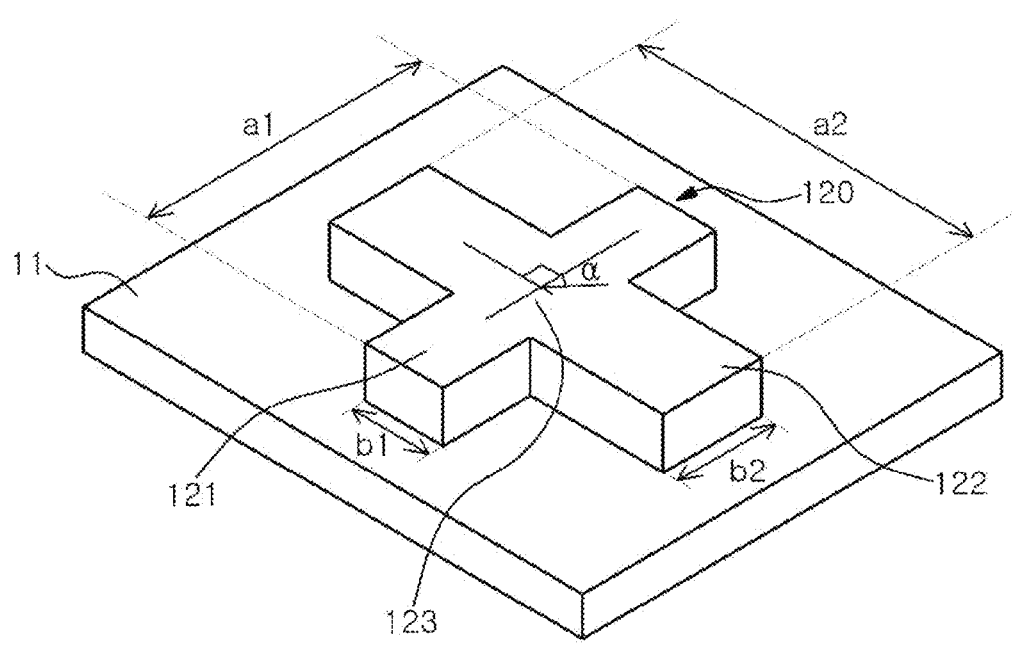
FIG. 2 is a perspective view showing a structure of a dielectric unit of FIG. 1.

FIG. 1 is a perspective view showing a dielectric-based reflective color filter according to an embodiment of the disclosure, and FIG. 2 is a perspective view showing a structure of a dielectric unit of FIG. 1.

Referring to FIGS. 1 and 2, the dielectric-based reflective color filter 10 according to an embodiment of the disclosure includes a substrate layer 11 capable of light reflection and a dielectric layer 12 formed on the substrate layer 11.

Herein, the dielectric layer 12 includes a plurality of dielectric units 120 having a first structure 121 extending in a first direction and a second structure 122 intersecting the first structure and extending in a second direction and the plurality of dielectric units 120 are spaced apart from one another on the substrate layer.

In the present embodiment, it may be understood that the first direction is a direction from the left lower end to the right upper end with reference to FIG. 2, and the second direction is a direction from the left upper end to the right lower end with reference to FIG. 2. However, the first direction and the second direction may be set for each dielectric unit 120.

Such a dielectric layer 12 may eliminate scattering parallel to the traveling direction of the incident light, and may amplify scattering in a direction opposite to the traveling direction of the light. In this case, the resonance wavelength band reflected according to the polarization of the incident light may be controlled by changing the structural properties of the dielectric unit 120. That is, the colors implemented by each dielectric unit 120 may be set differently according to the structural properties of the dielectric unit 120. Herein, the structural properties of the dielectric unit 120 include the length and width of the first structure 121, the length and width of the second structure 122, and the angle of the first direction. In some cases, the structural properties of the dielectric unit 120 may include the thickness of the second structure 122.

Further, the plurality of dielectric units 120 may be disposed to be spaced apart in the first direction and the second direction at predetermined intervals, as an example. Accordingly, the colors realized by each of the dielectric units 120 may be combined to display a predetermined image.

In this embodiment, the substrate layer 11 made of silicon dioxide ($SiO_2$) and the dielectric layer 12 made of amorphous silicon will be described. The larger the difference between the refractive indices of the substrate layer 11 and the dielectric layer 12 is, the more reflections may be adjusted to a wider range, and the clearer color may be achieved. As in this embodiment, in the case that the substrate layer 11 is made of silicon dioxide ($SiO_2$) and the dielectric layer 12 is made of amorphous silicon, the effects may be sufficiently obtained. However, the idea of the disclosure is not limited to this. For example, an electrically conductive dielectric layer such as ITO may be used as the substrate layer 11, and titanium dioxide ($TiO_2$), silicon germanium (SiGe), silicon hydride (Si:H), and the like having a high refractive indices and a low light absorption rate in a visible light region may be used as the dielectric layer 12.

Further, in this embodiment, the first direction and the second direction perpendicular to each other will be described as an example. In this case, since a distance between both ends of the first structure 121 and the second structure 122 may be sufficiently secured, it is possible to manufacture the first structure 121 and the second structure 122 more easily than when the first structure 121 and the second structure 122 are formed close to each other. However, the idea of the disclosure is not limited thereto, and the first direction and the second direction may have different angles other than the perpendicular. The dielectric unit 120, which is reacted with light polarized at a particular angle by being perpendicular to the first direction and the second direction and adjusting the sizes of the first structure 121 and the second structure 122, may exhibit an effect similar to that of a dielectric unit formed such that the first direction and the second direction have predetermined angles to react with the light polarized at the particular angle.

The first structure 121 and the second structure 122 may intersect each other around the intersection 123. That is, the intersection 123 may be understood as a part of the first structure 121 as well as a part of the second structure 122.

Further, the first structure 121 may be symmetrical in the first direction around the intersection 123, and the second structure 122 may also be symmetrical in the second direction around the intersection 123. As shown, if the first structure 121 and the second structure 122 are both symmetric around the intersection 123, the dielectric unit 120 may have a '+' shaped plane.

Meanwhile, the first structure 121 may have a rectangular plane. In this case, the length a1 of the first structure 121 may be 60 nm to 220 nm, and the width b1 may be 40 nm to 120 nm. Further, the second structure 122 may have a rectangular plane, and the length a2 of the second structure 122 may be 60 nm to 220 nm and the width b2 may be 40 nm to 120 nm. In this embodiment, the length means the width in the direction in which each structure extends, and the width means the width in the direction perpendicular to the direction in which each structure extends.

Thus, when the first structure 121 and the second structure 122 have a length of 60 to 220 nm and a width of 40 to 120 nm, respectively, light corresponding to a wavelength band of a color used in a display device may be generally reflected. In particular, as the size of the dielectric unit 120 increases, reflectance of red light increases, and as the size of the dielectric unit 120 becomes smaller, the reflectance of blue light tends to increase.

Meanwhile, a predetermined angle a with the polarized direction of the incident light may be formed by the first direction in which the first structure 121 extends. For example, the first direction may be parallel to the polarized direction of the incident light, and in this case, a is 0 degrees. Further, the second direction may be parallel to the polarized direction of the incident light, and in this case, a may be 90 degrees. For example, a in the plurality of dielectric units 120 shown in FIG. 1 are all set to be the same.

In this case, at least portion of the plurality of dielectric units 120 may be formed such that the first direction is different from other portions of the plurality of dielectric units 120. In other words, a portion α of the plurality of dielectric units 120 and the other portion α of the plurality of dielectric units 12 may be set differently. This may be understood to mean that the plurality of the dielectric units 120 may represent at least two or more colors.

Further, the at least portion of the plurality of dielectric units 120 may be formed such that the first direction is equal to other portions of the plurality of dielectric units.

In other words, one or more of the plurality of dielectric units 120 may be set equal to α. This may be understood to mean that there may be a plurality of dielectric units 120 representing one color.

Herein, the first structure 121 and the second structure 122 may each be a rectangular parallelepiped, and may share the intersection 123 as a part thereof. In this case, the height of the first structure 121 and the second structure 122, that is, the length protruding from the substrate layer 11 may be formed to be equal to each other. When the dielectric unit 120 is set as described above, the productivity may be improved because the dielectric unit 120 may be formed at one time by a process to be described later, that is, a deposition process.

As an example, the height of the first structure and the second structure may be set to 200 nm. In the disclosure, the color implemented by each dielectric unit may be changed by the structural properties of the first and second structures. The height of each structure may also affect the color that each dielectric structure implements. In other words, when the first structure and the second structure are formed to have a thickness of 200 nm, as in the present embodiment, pure R, G, and B colors may be implemented well.

As the thickness of the dielectric unit 120 becomes thinner, the resonance peak representing the color becomes closer to the blue light. This is because as the thickness of the dielectric unit 120 becomes thinner, the shorter wavelength (Blue side) becomes easier to resonate in the structure, while the wavelength of the red side may be difficult to raise the resonance in the structure since its wavelength is too long. Accordingly, it is necessary to optimize the thickness of the dielectric unit 120, and when the thickness is 200 nm, the pure R, G, and B may be realized.

Thus, the dielectric unit 120 may display various colors by changing five structural parameters such as the length and width of the first structure 121 and the second structure 122 and the angle of the first direction. In particular, when the first structure 121 and the second structure 122 have a rectangular plane and are formed symmetrically with respect to the intersection 123, and the first direction and the second direction are perpendicular to each other, there are advantages in that the control of the structural parameters may be easy and the design may be easy by predicting the colors expected theoretically.

Figure 3A:
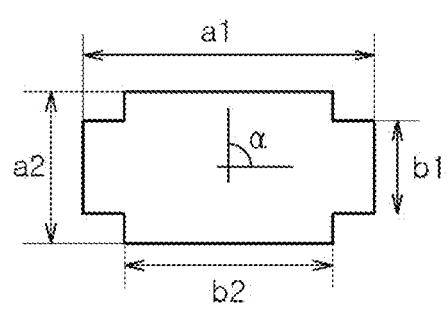
FIGS. 3a-3c are views showing another example of a dielectric unit of FIG. 1.
Figure 3B:
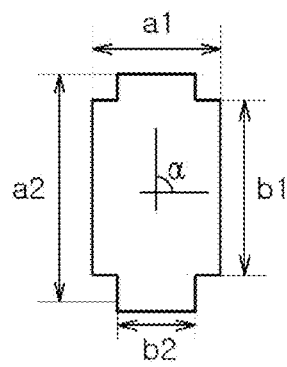
Figure 3C:
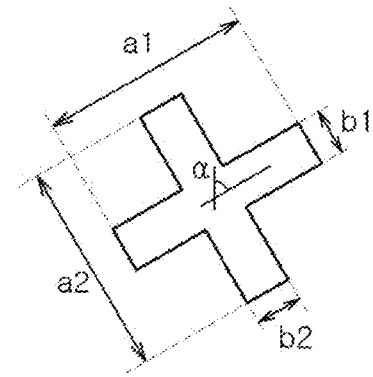

FIGS. 3a-3c are views showing another example of a dielectric unit of FIG. 1. Specifically, the three units shown in FIGS. 3a-3c are all formed with a height of 200 nm. In FIG. 3, an angle of the first direction may be set with respect to a vertical direction, and a first direction and a second direction may be perpendicular to each other. That is, the polarization direction of the incident light may be an up-and-down direction in FIGS. 3a-3c.

FIG. 3a is a dielectric unit 120 formed with a1=188 nm, b1=102 nm, a2=124 nm, b2=120 nm and α=90 degrees, and the dielectric unit 120 shown in FIG. 3a may reflect red light when white light is incident.

Further, FIG. 3b is a dielectric unit 120 formed with a1=60 nm, b1=102 nm, a2=124 nm, b2=30 nm and α=90 degrees, and the dielectric unit 120 shown in FIG. 3b may reflect green light when the white light is incident.

Further, FIG. 3c is a dielectric unit 120 formed with a1=156 nm, b1=30 nm, a2=156 nm, b2=30 nm and α=54 degrees, and the dielectric unit 120 shown in FIG. 3c may reflect blue light when the white light is incident.

Thus, the structure of such a dielectric unit 120 may be mentioned by way of example, and more colors may be realized by adjusting a1, b1, a2, b2, and α.

Figure 4:
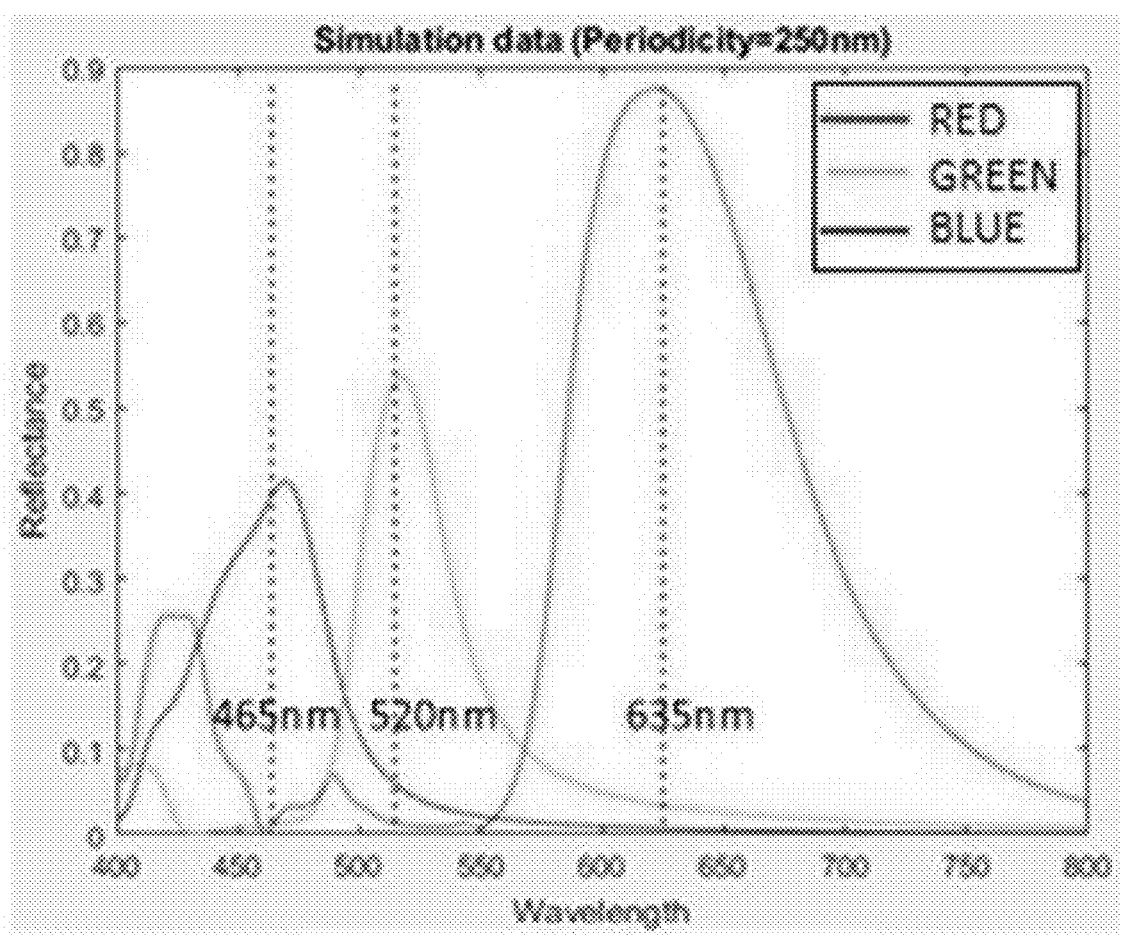
FIG. 4 is a graph showing a reflection spectrum of a dielectric-based reflective color filter according to an embodiment of the disclosure.

FIG. 4 is a graph showing a reflection spectrum of a dielectric-based reflective color filter according to an embodiment of the disclosure.

In FIG. 4, RED line may be a reflection spectrum of the dielectric unit 120 that strongly resonates at a wavelength corresponding to the red light and selectively reflects a wavelength around the red light, as shown in FIG. 3a Likewise, GREEN line and BLUE line may be a reflection spectrum of the dielectric unit 120 that selectively reflects the green light and the blue light, respectively, as shown in FIGS. 3b and 3c.

Referring to FIG. 4, it may be seen that each dielectric unit 120 may implement a specific color by strongly reflecting the wavelength band of the region corresponding to each color as intended in the design.

Figure 5:
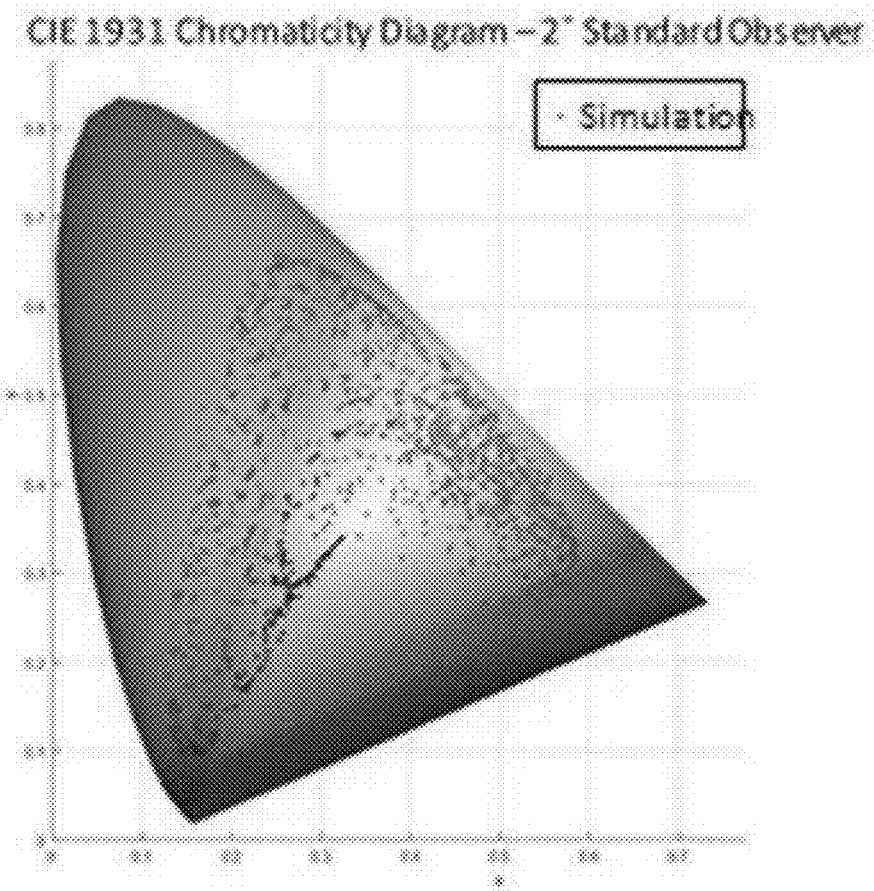
FIG. 5 is a graph showing a CIE chromaticity diagram of a dielectric-based reflective color filter according to an embodiment of the disclosure.

FIG. 5 is a graph showing a CIE chromaticity diagram of a dielectric-based reflective color filter according to an embodiment of the disclosure;

In the chromaticity diagram of FIG. 5, the dotted portion represents a color that may be obtained as a result of the simulation of the dielectric unit 120, and as a result of the simulation up to the present filing date, the more various combinations of structural parameters may be implemented, the more colors may be implemented.

Figure 6A:
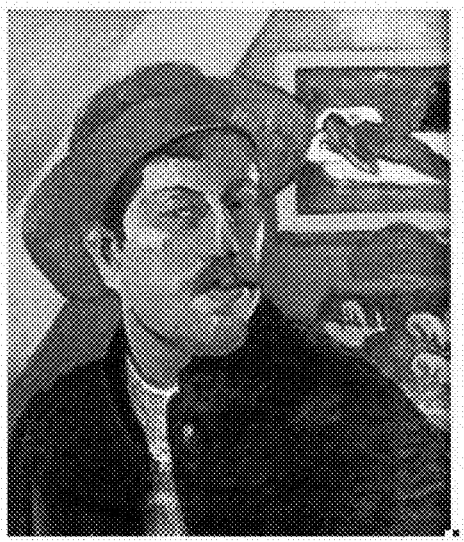
FIGS. 6a and 6b illustrate views showing an image actually implemented by a dielectric-based reflective color filter according to an embodiment of the disclosure.
Figure 6A:
Figure 6B:
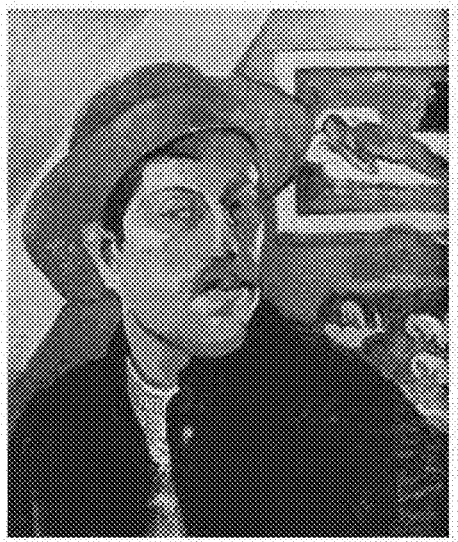
Figure 6B:

FIGS. 6a and 6b illustrate a view showing an image actually implemented by a dielectric-based reflective color filter according to an embodiment of the disclosure.

FIG. 6a is a target image to be implemented, and FIG. 6b is an image actually implemented by this disclosure. It may be seen that the dielectric-based reflective color filter 10 according to the present embodiment may exhibit color reproducibility similar to that of an actual image. The accuracy of such color reproducibility may be improved when the experiment and simulation of the structure of the dielectric unit 120 are additionally performed.

Hereinafter, a method of manufacturing the dielectric-based reflective color filter 10 will be described with reference to the drawings.

FIGS. 7a-7h illustrate process diagram showing a method of manufacturing a dielectric-based reflective color filter according to an embodiment of the disclosure.

Figure 7A:
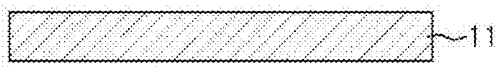
FIGS. 7a-7h illustrate process diagram showing a method of manufacturing a dielectric-based reflective color filter according to an embodiment of the disclosure.
Figure 7B:
Figure 7C:
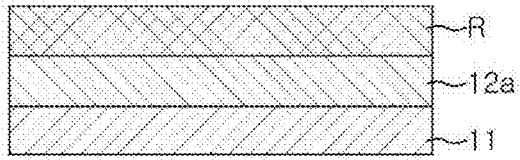
Figure 7D:
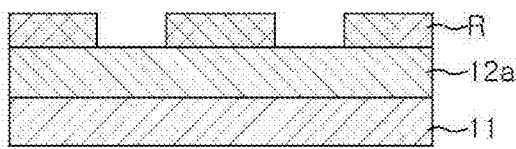
Figure 7E:
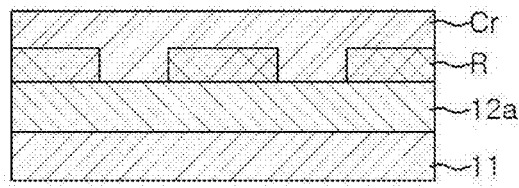
Figure 7F:
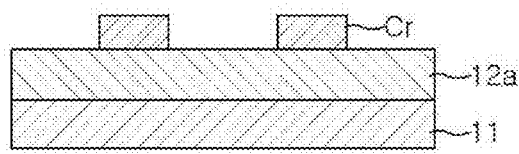
Figure 7G:
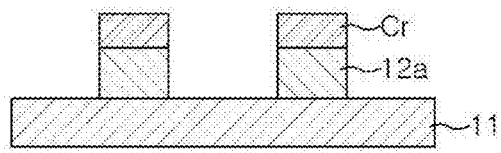
Figure 7H:
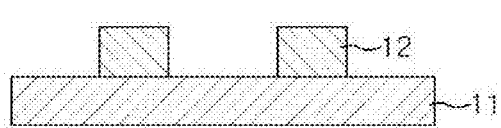

Referring to FIGS. 7a-7h, the method of manufacturing the dielectric-based reflective color filter 10 according to an embodiment of the disclosure may include preparing a substrate layer 11 (FIG. 7a), laminating a dielectric layer 12a to the substrate layer 11 (FIG. 7b), laminating a photoresist R to the dielectric layer 12a (FIG. 7c), forming on the photoresist R a pattern including a plurality of dielectric units having a first structure extending in a first direction and a second structure intersecting the first structure and extending in a second direction (FIG. 7d), depositing a film layer Cr on the pattern (FIG. 7e), removing a remaining film except the film corresponding to the pattern through a lift-off and the photoresist (FIG. 7f, and etching a portion except for the dielectric layer 12 corresponding to the pattern (FIG. 7g and FIG. 7h).

As described above, the substrate layer 11 may be silicon dioxide, the dielectric layer 12a may be amorphous silicon, and the dielectric layer 12a may be deposited on the substrate layer 11 by a PE-CVD process.

Further, the first direction and the second direction of the dielectric unit of the pattern may be perpendicular, and the first structure and the second structure may have a rectangular shape in a plane. This pattern may be formed by E-beam lithography, and the film may be made of chromium.

Further, the etching may also include etching for removing a portion of the dielectric layer 12a (FIG. 7g) and etchant-etching for removing the film layer (FIG. 7h).

The dielectric-based reflective color filter 10 according to an embodiment of the disclosure as described above and the dielectric-based reflective color filter manufactured by the manufacturing method described above may be applied to a display device, a zero power display and the like.

The conventional displays such as LCDs and OLEDs require a backlight unit and an LED unit that provide light from the inside by consuming power, and realize light with efficiency of about 10 percent of the power consumed. However, in the case of using the dielectric-based reflective color filter 10 according to the present embodiment, since the color may be realized without a power consumption source, it is very useful as a display device.

Although the dielectric-based reflective color filter, the manufacturing method thereof and the display device including the dielectric-based reflective color filter according to embodiments of the disclosure have been described above as specific embodiments, the disclosure is not limited thereto. The disclosure should be interpreted as having the broadest scope according to the disclosed basic idea. Those skilled in the art may implement the pattern of features not expressly stated in combination, substitution of the disclosed embodiments, but without departing from the scope of the disclosure. It will be apparent to those skilled in the art that various changes and modifications may be readily made without departing from the scope of the disclosure.

What is claimed is:

1. A dielectric-based reflective color filter, comprising:
a substrate layer capable of light reflection; and
a dielectric layer formed on the substrate layer,
wherein the dielectric layer includes a plurality of dielectric units configured by a first structure extending in a first direction and a second structure intersecting the first structure and extending in a second direction: and
the plurality of the dielectric units is arranged on the substrate layer so as to be spaced apart from each other.

2. The dielectric-based reflective color filter according to claim 1, wherein the first structure is symmetrical about an intersection where the first structure and the second structure intersect with each other.

3. The dielectric-based reflective color filter according to claim 2, wherein the second structure is symmetrical about the intersection.

4. The dielectric-based reflective color filter according to claim 1, wherein the first structure has a rectangular plane.

5. The dielectric-based reflective color filter according to claim 4, wherein the second structure has a rectangular plane.

6. The dielectric-based reflective color filter according to claim 1, wherein the first structure and the second structure are formed in a rectangular parallelepiped shape and have the same height.

7. The dielectric-based reflective color filter according to claim 6, wherein the first structure and the second structure has a height of 200 nm.

8. The dielectric-based reflective color filter according to claim 1, wherein the dielectric unit has a '+' shaped plane.

9. The dielectric-based reflective color filter according to claim 1, wherein the first direction and the second direction are perpendicular to each other.

10. The dielectric-based reflective color filter according to claim 9, wherein the first structure and the second structure have a length of 60 nm to 220 nm, and the first structure and the second structure have a width of 40 nm to 120 nm, and the center on the plane of the first structure and the second structure coincide with each other.

11. The dielectric-based reflective color filter according to claim 1, wherein at least portion of the plurality of dielectric units is formed such that the first direction is different from other portions of the plurality of dielectric units.

12. The dielectric-based reflective color filter according to claim 1, wherein at least portion of the plurality of dielectric units is formed such that the first direction is equal to other portions of the plurality of dielectric units.

13. The dielectric-based reflective color filter according to claim 1, wherein the first direction forms a predetermined angle with a polarized direction of incident light, and the second direction is perpendicular to the first direction.

14. The dielectric-based reflective color filter according to claim 1, wherein the substrate layer is made of silicon dioxide and the dielectric layer is made of amorphous silicon.

15. A display device comprising a dielectric-based reflective color filter according to claim 1.

16. A method of manufacturing a dielectric-based reflective color filter, comprising:
preparing a substrate layer;
laminating a dielectric layer to the substrate layer;
laminating a photoresist to the dielectric layer;
forming, on the photoresist, a pattern including a plurality of dielectric units having a first structure extending in a first direction and a second structure intersecting the first structure and extending in a second direction;
depositing a film layer on the pattern;
removing a remaining film except the film corresponding to the pattern through a lift-off and the photoresist; and
etching a portion except for the dielectric layer corresponding to the pattern.

17. The method according to claim 16, wherein the substrate layer is made of silicon dioxide and the dielectric layer is made of amorphous silicon.

18. The method according to claim 17, wherein the amorphous silicon is deposited on the substrate layer by a PE-CVD process.

19. The method according to claim 16, wherein the first direction and the second direction are perpendicular to each other, and the first structure and the second structure have a rectangular shape in a plane.

20. The method according to claim 16, wherein the pattern is formed by E-beam lithography and the film is made of chromium.

* * * * *